United States Patent
Loboda et al.

(10) Patent No.: US 8,765,091 B2
(45) Date of Patent: Jul. 1, 2014

(54) METHOD TO MANUFACTURE LARGE UNIFORM INGOTS OF SILICON CARBIDE BY SUBLIMATION/CONDENSATION PROCESSES

(75) Inventors: Mark Loboda, Bay City, MI (US);
Seung Ho Park, Midland, MI (US);
Victor Torres, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 436 days.

(21) Appl. No.: 12/744,532

(22) PCT Filed: Oct. 8, 2008

(86) PCT No.: PCT/US2008/079126
§ 371 (c)(1),
(2), (4) Date: Jul. 1, 2010

(87) PCT Pub. No.: WO2009/075935
PCT Pub. Date: Jun. 18, 2009

(65) Prior Publication Data
US 2012/0114545 A1    May 10, 2012

Related U.S. Application Data

(60) Provisional application No. 61/013,083, filed on Dec. 12, 2007.

(51) Int. Cl.
| | |
|---|---|
| *C01B 31/36* | (2006.01) |
| *C01B 33/08* | (2006.01) |
| *C01B 33/06* | (2006.01) |
| *C01B 31/30* | (2006.01) |
| *C01B 33/00* | (2006.01) |
| *C30B 25/00* | (2006.01) |

(52) U.S. Cl.
CPC ............... *C01B 31/36* (2013.01); *C01B 31/30* (2013.01); *C01B 33/00* (2013.01); *C01P 2006/80* (2013.01); *C30B 25/005* (2013.01)
USPC ............ 423/345; 423/344; 423/343; 428/698

(58) Field of Classification Search
None
See application file for complete search history.

(56) References Cited

U.S. PATENT DOCUMENTS

| | | | |
|---|---|---|---|
| 2,854,364 A | | 9/1958 | Lely et al. |
| 5,985,024 A | | 11/1999 | Balakrishna et al. |
| 7,048,798 B2 | | 5/2006 | Maruyama et al. |
| 7,105,053 B2 | * | 9/2006 | Winterton et al. ............. 117/75 |
| 2002/0106535 A1 | * | 8/2002 | Brese et al. ................... 428/698 |
| 2013/0122278 A1 | * | 5/2013 | Tsuzukihashi et al. ....... 428/220 |
| 2014/0065051 A1 | * | 3/2014 | Kubota et al. ................ 423/345 |

FOREIGN PATENT DOCUMENTS

JP         06316499 A  *  11/1994

OTHER PUBLICATIONS

Wellmann et al.; Growth of Silicon Carbide Bulk Crystals with a Modified Physical Vapor Transport Technique; Chemical Vapor Deposition; 12, 557-561; 2006.*
Muller, Ralf, et. al., "Growth of Silicon Carbide Bulk Crystals wth a Modified Physical Vapor Transport Technique," vol. 12, Jan. 2006, pp. 557-561.
Sleutjes, Andrew, et. al., "Advanced Methods of Producing Ultra-Pure Silicon Carbide Products," vol. 17, Jun. 21, 2004, pp. 1-4.
JP 06-316499, Nov. 15, 1994, "Production of SiC Single Crystal". Abstract only.
Ota, S., et. al., "High quality SiC bulk growth by sublimation method using elemental Silicon and Carbon powder as SiC source materials," Materials Science Forum, 2004, pp. 115-118, vols. 457-460.
Wang, Xiaolin, et. al., "Increase of SiC sublimation growth rate by optimizing of powder packaging," Journal of Crystal Growth, Nov. 8, 2006, pp. 1-11, Department of Mechanical Engineering, State University of New York at Stony Brook.
Tairov, Yu.M., et. al., "General Principles of Growing Large-Size Single Crystals of Various Silicon Carbide Polytypes," Journal of Crystal Growth, 1981, pp. 146-150, vol. 52.

* cited by examiner

*Primary Examiner* — Guinever Gregorio
(74) *Attorney, Agent, or Firm* — Timothy J. Troy

(57) ABSTRACT

This invention relates to a method for the manufacture of monolithic ingot of silicon carbide comprising: i) introducing a mixture comprising polysilicon metal chips and carbon powder into a cylindrical reaction cell having a lid; ii) sealing the cylindrical reaction cell of i); iii) introducing the cylindrical reaction cell of ii) into a vacuum furnace; iv) evacuating the furnace of iii); v) filling the furnace of iv) with a gas mixture which is substantially inert gas to near atmospheric pressure; vi) heating the cylindrical reaction cell in the furnace of v) to a temperature of from 1600 to 2500° C.; vii) reducing the pressure in the cylindrical reaction cell of vi) to less than 50 torr but not less than 0.05 torr; and viii) allowing for substantial sublimation and condensation of the vapors on the inside of the lid of the cylindrical reaction cell of vii).

12 Claims, No Drawings

METHOD TO MANUFACTURE LARGE UNIFORM INGOTS OF SILICON CARBIDE BY SUBLIMATION/CONDENSATION PROCESSES

CROSS REFERENCE TO RELATED APPLICATIONS

This application is a U.S. national stage filing under 35 U.S.C. §371 of PCT Application No. PCT/US08/079,126 filed on 8 Oct. 2008, currently pending, which claims the benefit of U.S. Provisional Patent Application No. 61/013,083 filed 12 Dec. 2007 under 35 U.S.C. §119 (e). PCT Application No. PCT/US08/079,126 and U.S. Provisional Patent Application No. 61/013,083 are hereby incorporated by reference.

BACKGROUND OF THE INVENTION

The present invention describes a method to produce large ingots of silicon carbide (SiC). The method can be tailored to produce polycrystalline SiC, or crystalline SiC of any polytype.

Crystalline silicon carbide is a semiconductor material which is useful for the fabrication of silicon carbide devices which can operate at higher power and higher temperatures when compared to traditional semiconductor crystalline materials such as silicon and gallium arsenide.

Bulk crystalline SiC is a difficult material to grow since the growth process requires extremely high temperatures (1900-2500° C.). The most common method for the growth of bulk crystalline SiC is sublimation.

The benchmark art for the growth of bulk crystalline SiC in commercial applications is that of Davis, et. al. U.S. Pat. RE34,861 which describes a sublimation method. The method therein emerged as an improvement on methods previously reported by Lely (U.S. Pat. No. 2,854,364), Tairov (see J. Crystal Growth, 52 (1981) pp. 46) and many others.

Sublimation reactions for bulk crystalline SiC growths are commonly conducted in a closed cylindrical reaction cell in which is located a furnace. The heat source for the reaction can be resistive heating or RF induction heating. The reaction cell is typically made of graphite. A seed crystal is placed inside the cell, usually at the top and the source material for growth of the crystal is placed opposite the seed. Upon heating the reaction cell, the source material is vaporized and it then condenses on the seed crystal.

While the process described above is relatively simple to envision, in practice it is hard to realize. The control of the reaction and vapor transport depends on a plurality of variables, none of which are directly under the users control during the process. The process cannot be monitored in-situ as it is performed in a closed, opaque cell. The transport of vapor from the source to the seed, and its condensation and crystallization is significantly influenced by the temperature distribution in the cell. As material vaporizes and transports from the source region to the seed region the temperature distribution changes. All of these variables need to be coordinated a priori to execution to achieve successful crystal growth.

Typically a powder form of silicon carbide is used as the source material. Selection of the particle size and its distribution will impact the growth process. Davis, et. al., teach that the powder should be of constant polytype composition "which are made up of a constant proportion of polytypes, including single polytypes." In doing so this maximizes the repeatability of the vapor composition. Wang, et. al. (J. Crystal Growth (2007) doi:10.1016/j.jcrysgro.2007.03.022) and the references therein show that SiC powder particle size geometries effect packing and different SiC particle sizes can be used to increase the crystal growth rate.

The purity of the SiC powder will impact the purity of the SiC crystal and in turn, affect its resistivity value and conduction of electricity. Low cost, high purity silicon carbide powders are not readily available. Specific control of the reaction environment (temperature, pressure, etc) during sublimation SiC crystal growth is required to limit incorporation of undesired impurities from the source into the SiC crystal. Example impurities of concern in SiC crystal growth for semiconductor device applications include boron, phosphorous, nitrogen, aluminum, titanium, vanadium, and iron.

Ota, et. al. (Materials Science Forum Vols. 457-460 (2004) p. 115) show the growth of high resistivity SiC crystals using mixtures of pure silicon and carbon powder can be achieved by variation of the relative amounts of silicon and carbon in the powder mixture. They report the results using a source based on mixture of silicon and carbon powder mixtures, and they discuss sintered the mixture gives better results compared to a SiC powder source. The silicon and carbon powder sources show reduced incorporation of boron and aluminum. This work does not offer insight to the repeatability of their method.

Other variants of source materials for SiC crystal growth have been reported. Balakrishna, et. al. (U.S. Pat. No. 5,985,024) developed a method to reduce incorporation of impurities in SiC crystal growth by using a novel SiC in-situ source method wherein high purity silicon metal is vaporized in the presence of high purity hydrocarbon gas to deliver the species for silicon carbide growth. Maruyama, et. al. (U.S. Pat. No. 7,048,798 B2) describes a method for the formation of SiC source powder material by reaction of organosilicon materials and carbon containing resins.

Without control of the SiC powder size and packing, a lack of repeatability of the SiC crystal growth process will occur. Purity control of source materials is important to yield high purity SiC crystals. More efforts are required to create alternatives to common SiC powder that are low in impurities and useful for the growth of SiC crystals. A repeatable process to grow SiC crystals suitable for use in semiconductor device applications requires a delicate balance and management of all these variables.

BRIEF SUMMARY OF THE INVENTION

A first embodiment of this invention relates to a method for the manufacture of monolithic ingot of silicon carbide comprising: i) introducing a mixture comprising polysilicon metal chips and carbon powder into a cylindrical reaction cell having a lid; ii) sealing the cylindrical reaction cell of i); iii) introducing the cylindrical reaction cell of ii) into a vacuum furnace; iv) evacuating the furnace of iii); v) filling the furnace of iv) with a gas mixture which is substantially inert gas to near atmospheric pressure; vi) heating the cylindrical reaction cell in the furnace of v) to a temperature of from 1600 to 2500° C.; vii) reducing the pressure in the cylindrical reaction cell of vi) to less than 50 torr but not less than 0.05 torr; and viii) allowing for substantial sublimation and condensation of the vapors on the inside of the lid of the cylindrical reaction cell of vii).

A second embodiment of this invention relates to where the method described above can further comprise: ix) introducing the product of viii) into a second cylindrical reaction cell having a silicon carbide seed crystal located on the inner surface of its lid; x) sealing the cylindrical reaction cell of ix);

xi) introducing the cylindrical reaction cell of x) into a vacuum furnace; xii) evacuating the furnace of xi); xiii) filling the furnace of xii) with a gas mixture which is substantially inert gas to near atmospheric pressure; xiv) heating the cylindrical reaction cell in the furnace of xiii) to a temperature of from 1600 to 2500° C.; xv) reducing the pressure in the cylindrical reaction cell of xiv) to less than 50 torr but not less than 0.05 torr; and xvi) allowing for substantial sublimation and condensation of the vapors on the inside of the lid of the cylindrical reaction cell of xv).

DETAILED DESCRIPTION OF THE INVENTION

In the method of this invention the polysilicon metal chips are typically obtained from a CVD based growth method such as the Siemens method (Chapter 1-2 in W. O'Mara, R. Herring, L. Hunt; "Handbook of Semiconductor Silicon Technology," Noyes Publications, Norwich, N.Y., 1990 ISBN 0-8155-1237-6). The polysilicon chips are segregated by size, and the carbon powder is segregated by size to a value that is different and significantly smaller than the polysilicon size range. The polysilicon metal chips are selected with a unique controlled size distribution. The polysilicon metal chips can be loaded as a single ingot or separated into several pieces. Bulk hyperpure polysilicon (>99.99% atomic) is typically broken into chips by a manual, mechanical process. The polysilicon metal chips have an irregular shape. The polysilicon metal chips are segregated by maximum dimension into sizes of from 0.5 to 10 mm, or alternatively 0.5 to 3.5 mm, or alternatively 1 to 3.5 mm.

Typically the carbon powder is of much smaller dimension than the polysilicon metal chips. The carbon powder is typically sifted into sizes of from 5 to 125 um. The polysilicon chips and carbon powder are loaded into a cylindrical reaction cell. The total mass of the polysilicon/carbon mixture is from 0.3 to 2.0 kg. Amounts of polysilicon metal chips and carbon powder are such that there is a molar ratio of polysilicon to carbon from 0.9 to 1.2 on a molar ratio basis. The cylindrical reaction cell is filled with the mixture of polysilicon metal chips and carbon powder sufficient to occupy from 30% to 60% of the total reaction cell volume, or alternatively 35 to 50% of the total volume of the reaction cell.

The cylindrical reaction cell is typically comprised of graphite is typically electrically conducting. The cylindrical electrically conducting graphite reaction cell has a threaded lid. The height and diameter of the reaction cell are designed to allow volume to hold the mixture comprising polysilicon metal chips and carbon powder at the bottom, and provide open volume at the top.

The cylindrical reaction cell is sealed using any known means available, however, typically the cylindrical reaction cell is sealed by mechanical methods. The cylindrical reaction cell is sealed by tightening onto the cell the matching threaded lid.

The vacuum furnace is exemplified by a vacuum tight chamber whose volume is large enough to hold the reaction cell. The furnace heat source can be incorporated from the outside (as in an RF induction system), or the inside (a resistively heated system).

The furnace is evacuated by a mechanical oil-based or dry type pumping system capable to achieve pressures below 0.05 torr, and can also have a turbomolecular pump to achieve low vacuum conditions (<1E-3 torr).

The gas mixture which is substantially inert gas to near atmospheric pressure is exemplified by argon gas or helium gas. The gas mixture can further comprise residual nitrogen gas or oxygen, but it is typically in an amount of less than 0.5% of the total gas mixture.

The heating of the cylindrical reaction cell is typically accomplished by RF induction heating.

The cylindrical reaction is heated to a temperature of from 1600° C. to 2500° C., and alternatively from 1975° C. to 2200° C. Pressure is established near atmospheric pressure (300-600 torr) and the container is gradually heated to approximately 1600-2500° C. Under the high temperature conditions the polysilicon metal chips will melt and react with the carbon powder. These conditions are held for about 10 to 100 hours and then the reaction cell is cooled.

The pressure in the cylindrical reaction cell is reduced by opening the throttle valve on the vacuum pump to afford higher pumping speed. This is done with an automatic pressure control system. The pressure is reduced to less than 50 torr but not less than 0.05 torr and held for 30-100 hours and then cooled.

The time period for substantial sublimation and condensation of the vapors on the inside of the lid of the cylindrical reaction cell typically is from 24 to 100 hours.

The reaction cell of i) also can have a silicon carbide seed crystal located on the inner surface of its lid. The silicon carbide seed crystal is exemplified by a polished silicon carbide disk or a wafer of single crystal silicon carbide. The polytype of the seed crystal is the same as the desired product crystal.

When the container is opened, a large cylindrical ingot of bulk polycrystalline silicon carbide ingot has formed on the lid.

In the second embodiment of this invention the method described hereinabove can further comprise: ix) introducing the product of viii) into a second cylindrical reaction cell having a silicon carbide seed crystal located on the inner surface of its lid; x) sealing the cylindrical reaction cell of ix); xi) introducing the cylindrical reaction cell of x) into a vacuum furnace; xii) evacuating the furnace of xi); xiii) filling the furnace of xii) with a gas mixture which is substantially inert gas to near atmospheric pressure; xiv) heating the cylindrical reaction cell in the furnace of xiii) to a temperature of from 1600 to 2500° C.; xv) reducing the pressure in the cylindrical reaction cell of xiv) to less than 50 torr but not less than 0.05 torr; and xvi) allowing for substantial sublimation and condensation of the vapors on the inside of the lid of the cylindrical reaction cell of xv).

The second cylindrical reaction cell, silicon carbide seed crystal, the method to seal the cylindrical reaction cell, the furnace, the evacuation of the furnace, the gas mixture which is substantially inert gas to near atmospheric pressure, the heating of the cylindrical reaction cell, the temperature to which the cylindrical reaction cell is heated, the method of reducing pressure in the cylindrical reaction cell, and the time period for substantial sublimation and condensation of the vapors on the inside of the lid of the cylindrical reaction cell are all as described above for the first embodiment of this invention including preferred embodiments there of.

By using the method of this invention the problems associated with silicon and silicon carbide powders and control of vapor composition are avoided and repeatable SiC crystal growth is realized.

The resultant product of any of these embodiments is an ingot of SiC. If no seed crystal is present during vapor transport the ingot will be polycrystalline. If a seed crystal is present, the polytype of the ingot is determined by the polytype of the seed. Most common polytypes include 3C, 4H, and 6H. Using the above methods it is possible to grow crystals of thickness 1-50 mm and above, and diameters 50-150 mm, as long as the original mass of SiC source material is larger than the mass of the desired SiC crystal and that the height of the graphite container above the source material exceeds the expected height of the crystal.

The ingot of SiC made by these methods can be machined and cut into wafers. The wafers are useful for the fabrication of semiconductor devices.

In addition to argon, a dopant such as a nitrogen or phosphorous containing gas is fed into the furnace, the SiC material grown will be conducting, n-type. In addition to argon, a dopant such as a boron or aluminum containing gas is fed into the furnace, the SiC material grown will be conducting, p-type. The dopant is added at the time the furnace pressure is reduced from atmospheric pressure to the target pressure.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt. %.

Example 1

An ultra high purity (UHP) cylindrical graphite reaction cell approximately 20 cm high and 10 cm internal diameter was filled with a mixture of UHP polysilicon chips and carbon powder. The polysilicon pieces conform to a maximum dimension into the size range of 0.5 to 3.5 mm. Carbon powder particle size range was 5-125 micrometers. The total weight of the polysilicon/carbon mixture was approximately 0.75 kg, of this 70% of the weight was polysilicon. The powder mixture is filled to approximately 45% of the container volume. The reaction cell was sealed with a graphite lid. The cell was wrapped in graphite insulation and a port through the insulation provided to allow the temperature of the cell to be monitored using an optical pyrometer. The reaction cell was then loaded into a vacuum furnace. The furnace chamber was evacuated to a pressure less than 30 mtorr and then filled with argon to a pressure greater than 350 torr. The temperature of the reaction cell was raised to 2200° C. At this point the pressure was reduced to 5 torr and the pressure held constant for 20 hours. The cell was cooled to room temperature. A cylindrical ingot of polycrystalline SiC was formed in the upper volume of the cell. The mass of the polycrystalline SiC ingot was approximately 600 grams.

The polycrystalline SiC ingot was loaded into the bottom an ultra high purity (UHP) cylindrical graphite reaction cell approximately 20 cm high and 10 cm internal diameter. A 4H SiC crystal was mounted on the inside of a graphite lid and this lid was used to seal the reaction cell. The cell was wrapped in graphite insulation and a port through the insulation provided to allow the temperature of the cell to be monitored using an optical pyrometer. The reaction cell was then loaded into a vacuum furnace. The furnace chamber was evacuated and then filled with argon gas to a pressure of 600 torr. Over a period of 3 hours the temperature of the reaction cell was raised to 2180° C. At this point the pressure in the furnace was reduced to 2 torr and a mixture of argon and nitrogen gas was delivered to the chamber.

These conditions were maintained for approximately 80 hours. A crystal of 4H SiC was formed on the inside lid of the reaction cell. The nominal resistivity of the 4H SiC was measured to be about 0.025 ohm-cm and the concentration of nitrogen was $7\times10^{18}$ atoms/cm$^3$.

A wafer was cut from the top half of the crystal and the impurities measured using secondary ion mass spectroscopy (SIMS). The results are listed in Table 1.

TABLE 1

| Results of Test AI6018/BE6021 | |
|---|---|
| Element | Concentration (atoms/cm$^3$) |
| P | Less than $1 \times 10^{14}$* |
| B | $1.6 \times 10^{15}$ |
| Al | $5.9 \times 10^{13}$ |
| Ti | Less than $6 \times 10^{12}$* |
| V | Less than $2 \times 10^{12}$* |
| Fe | Less than $2 \times 10^{14}$* |

*this is the detection limit of the SIMS analysis

Example 2

An ultra high purity (UHP) cylindrical graphite reaction cell approximately 20 cm high and 10 cm internal diameter was filled with a mixture of UHP polysilicon chips and carbon powder. The polysilicon pieces conform to a maximum dimension into the size range of 0.5 to 3.5 mm. Carbon powder particle size range was 5-125 micrometers. The total weight of the polysilicon/carbon mixture was approximately 0.75 kg, of this 70% of the weight was polysilicon. The powder mixture is filled to approximately 45% of the container volume. The reaction cell was sealed with a graphite lid. The cell was wrapped in graphite insulation and a port through the insulation provided to allow the temperature of the cell to be monitored using an optical pyrometer. The reaction cell was then loaded into a vacuum furnace. The furnace chamber was evacuated to a pressure less than 30 mtorr and then filled with argon to a pressure greater than 350 torr. The temperature of the reaction cell was raised to 2200° C. At this point the pressure was reduced to 5 torr and the pressure held constant for 20 hours. The cell was cooled to room temperature. A cylindrical ingot of polycrystalline SiC was formed in the upper volume of the cell. The mass of the polycrystalline SiC ingot was approximately 500 grams.

The polycrystalline SiC ingot was loaded into the bottom an ultra high purity (UHP) cylindrical graphite reaction cell approximately 20 cm high and 10 cm internal diameter. A 4H SiC crystal was mounted on the inside of a graphite lid and this lid was used to seal the reaction cell. The cell was wrapped in graphite insulation and a port through the insulation provided to allow the temperature of the cell to be monitored using an optical pyrometer. The reaction cell was then loaded into a vacuum furnace. The furnace chamber was evacuated and then filled with argon to a pressure of 600 torr. Over a period of 3 hours the temperature of the reaction cell was raised to 2180° C. At this point the pressure in the furnace was reduced to 2.0 torr. These conditions were maintained for approximately 80 hours. A crystal of 4H SiC was formed on the inside lid of the reaction cell. The nominal resistivity of the 4H SiC was measured to be greater than $1\times10^4$ ohm-cm and the concentration of nitrogen was $5\times10^{16}$ atoms/cm$^3$. A wafer was cut from the top half of the crystal and the impurities measured using secondary ion mass spectroscopy (SIMS). The results are listed in Table 2.

TABLE 2

Results of Test Al6008/BE6008

| Element | Concentration (atoms/cm$^3$) |
|---|---|
| P | Less than $1 \times 10^{14}$ |
| B | $2.3 \times 10^{15}$ |
| Al | $7.7 \times 10^{13}$ |
| Ti | Less than $6 \times 10^{12}$* |
| V | Less than $2 \times 10^{12}$* |
| Fe | Less than $2 \times 10^{14}$* |

*this is the detection limit of the SIMS analysis

That which is claimed is:

1. A method for the manufacture of monolithic ingots of silicon carbide having a polytype of 4H and having a diameter of 50 to 150 mm comprising:
    i) introducing a mixture comprising polysilicon metal chips segregated by maximum dimension into sizes from 0.5 to 10 mm and carbon powder sifted into sizes from 5 to 125 um in an amount such that the molar ratio of polysilicon to carbon from 0.9 to 1.2 on a molar ratio basis into a first cylindrical reaction cell having a lid;
    ii) sealing the cylindrical reaction cell of i);
    iii) introducing the cylindrical reaction cell of ii) into a vacuum furnace;
    iv) evacuating the furnace of iii);
    v) filling the furnace of iv) with a gas mixture which is substantially inert gas to near atmospheric pressure;
    vi) heating the polysilicon metal chips and the carbon powder in the cylindrical reaction cell in the furnace of v) to a temperature of from 1600 to 2500° C.;
    vii) reducing the pressure in the furnace after vi) to less than 50 torr but not less than 0.05 torr; and
    viii) allowing for substantial sublimation and condensation of the vapors on the inside of the lid of the cylindrical reaction cell of vii).

2. A method according to claim 1 wherein the dimension and shape of the polysilicon metal chips and carbon powder are substantially different.

3. A method according to claim 1 wherein the polysilicon chips are segregated by maximum dimension into sizes from of 1 to 3.5 mm.

4. A method according to claim 1 wherein the polysilicon metal and carbon powder mixture occupies 35-50% of the total volume of the reaction cell.

5. A method according to claim 1 wherein the gas mixture comprises argon gas.

6. A method according to claim 1 where the reaction cell is comprised of electrically conducting graphite.

7. A method according to claim 1 wherein the reaction cell of i) has a silicon carbide seed crystal having a polytype of 4H located on the inner surface of its lid.

8. A method according to claim 1 wherein the method further comprises:
    ix) introducing the product of viii) into a second cylindrical reaction cell having a silicon carbide seed crystal located on the inner surface of its lid;
    x) sealing the cylindrical reaction cell of ix);
    xi) introducing the cylindrical reaction cell of x) into a vacuum furnace;
    xii) evacuating the furnace of xi);
    xiii) filling the furnace of xii) with a gas mixture which is substantially inert gas to near atmospheric pressure;
    xiv) heating the cylindrical reaction cell in the furnace of xiii) to a temperature of from 1600 to 2500° C.; and
    xv) reducing the pressure in the cylindrical reaction cell of furnace after xiv) to less than 50 torr but not less than 0.05 torr; and
    xvi) allowing for substantial sublimation and condensation of the vapors on the inside of the lid of the cylindrical reaction cell of xv).

9. A method according to claim 8 wherein the cylindrical reaction cell is comprised of electrically conducting ultra high purity graphite and the silicon carbide seed crystal has a polytype of 4H.

10. A method according to claim 1 wherein the cylindrical reaction cell is comprised of electrically conducting ultra high purity graphite, the carbon powder is ultra high purity carbon powder and polysilicon chip is ultra high purity polysilicon chip.

11. A method according to claims 1 wherein the gas mixture used to refill the furnace after evacuation further comprises a doping gas.

12. A method according to claim 11 wherein the doping gas is nitrogen gas, a phosphorous containing gas, a boron containing gas or aluminum containing gas.

* * * * *